(12) United States Patent
Xi et al.

(10) Patent No.: US 8,659,852 B2
(45) Date of Patent: Feb. 25, 2014

(54) WRITE-ONCE MAGENTIC JUNCTION MEMORY ARRAY

(75) Inventors: Haiwen Xi, Prior Lake, MN (US); Song S. Xue, Edina, MN (US)

(73) Assignee: Seagate Technology LLC, Cupertino, CA (US)

( * ) Notice: Subject to any disclaimer, the term of this patent is extended or adjusted under 35 U.S.C. 154(b) by 1343 days.

(21) Appl. No.: 12/106,363

(22) Filed: Apr. 21, 2008

(65) Prior Publication Data
US 2009/0262467 A1 Oct. 22, 2009

(51) Int. Cl.
*G11B 5/33* (2006.01)

(52) U.S. Cl.
USPC .......................................................... 360/313

(58) Field of Classification Search
None
See application file for complete search history.

(56) References Cited

U.S. PATENT DOCUMENTS

| | | |
|---|---|---|
| 4,733,371 A | 3/1988 | Terada |
| 5,191,223 A | 3/1993 | Munekata |
| 5,646,419 A | 7/1997 | McCaldin |
| 5,673,225 A | 9/1997 | Jeong |
| 5,761,115 A | 6/1998 | Kozicki |
| 5,920,446 A | 7/1999 | Gill |
| 5,982,670 A | 11/1999 | Yamashita |
| 6,072,718 A | 6/2000 | Abraham |
| 6,178,136 B1 | 1/2001 | Lin |
| 6,226,197 B1 | 5/2001 | Nishimura |
| 6,252,796 B1 | 6/2001 | Lenssen |
| 6,381,106 B1 | 4/2002 | Pinarbasi |
| 6,469,926 B1 | 10/2002 | Chen |
| 6,532,164 B2 | 3/2003 | Redon |
| 6,542,000 B1 | 4/2003 | Black |
| 6,569,745 B2 | 5/2003 | Hsu |
| 6,584,016 B2 | 6/2003 | Park |
| 6,603,677 B2 | 8/2003 | Redon et al. |
| 6,633,498 B1 | 10/2003 | Engel |
| 6,639,830 B1 | 10/2003 | Heide |
| 6,643,168 B2 | 11/2003 | Okazawa |

(Continued)

FOREIGN PATENT DOCUMENTS

| GB | 2 422 735 | 8/2006 |
|---|---|---|
| WO | WO 2008/100868 | 8/2008 |

OTHER PUBLICATIONS

Sun, J.Z., Spin Angular Momentum Transfer in Current-Perpendicular Nanomagnetic Junctions, IBM J. Res & Dev., vol. 50, No. 1, Jan. 2006, pp. 81-100.
Baek et al., Tech. Dig. IEDM (2004) 587.

(Continued)

*Primary Examiner* — David D Davis
(74) *Attorney, Agent, or Firm* — Mueting Raasch & Gebhardt PA (57) ABSTRACT

A magnetic junction memory array and methods of using the same are described. The magnetic junction memory array includes a plurality of electrically conductive word lines extending in a first direction, a plurality of electrically conductive bit lines extending in a second direction and forming a cross-point array with the plurality of electrically conductive word lines, and a memory cell proximate to, at least selected, cross-points forming a magnetic junction memory array. Each memory cell includes a magnetic pinned layer electrically between a magnetic bit and an isolation transistor. The isolation transistor has a current source and a gate. The current source is electrically coupled to the cross-point bit line and the gate is electrically coupled to the cross-point word line. An electrically conductive cover layer is disposed on and in electrical communication with the magnetic bits.

20 Claims, 6 Drawing Sheets

(56) References Cited

U.S. PATENT DOCUMENTS

| | | |
|---|---|---|
| 6,700,753 B2 | 3/2004 | Singleton |
| 6,703,645 B2 | 3/2004 | Ohno |
| 6,711,051 B1 | 3/2004 | Poplevine |
| 6,711,067 B1 | 3/2004 | Kablanian |
| 6,714,444 B2 | 3/2004 | Huai |
| 6,741,492 B2 | 5/2004 | Nii |
| 6,744,086 B2 | 6/2004 | Daughton |
| 6,759,263 B2 | 7/2004 | Ying |
| 6,765,819 B1 | 7/2004 | Bhatacharyya |
| 6,774,391 B1 | 8/2004 | Cowburn |
| 6,781,867 B2 | 8/2004 | Kurth |
| 6,781,871 B2 | 8/2004 | Park |
| 6,801,415 B2 | 10/2004 | Slaughter |
| 6,818,961 B1 | 11/2004 | Rizzo |
| 6,829,161 B2 | 12/2004 | Huai |
| 6,831,312 B2 | 12/2004 | Slaughter |
| 6,834,005 B1 | 12/2004 | Parkin |
| 6,835,423 B2 | 12/2004 | Chen |
| 6,838,740 B2 | 1/2005 | Huai |
| 6,842,317 B2 | 1/2005 | Sugita |
| 6,842,368 B2 | 1/2005 | Hayakawa |
| 6,845,038 B1 | 1/2005 | Shukh |
| 6,847,547 B2 | 1/2005 | Albert |
| 6,850,433 B2 | 2/2005 | Sharma |
| 6,864,551 B2 | 3/2005 | Tsang |
| 6,888,703 B2 | 5/2005 | Dieny et al. |
| 6,888,742 B1 | 5/2005 | Nguyen |
| 6,909,633 B2 | 6/2005 | Tsang |
| 6,914,807 B2 | 7/2005 | Nakamura |
| 6,920,063 B2 | 7/2005 | Huai |
| 6,930,910 B2 | 8/2005 | Oh |
| 6,933,155 B2 | 8/2005 | Albert |
| 6,943,040 B2 | 9/2005 | Min |
| 6,950,335 B2 | 9/2005 | Dieny |
| 6,958,927 B1 | 10/2005 | Nguyen |
| 6,963,500 B2 | 11/2005 | Tsang |
| 6,965,522 B2 | 11/2005 | Lung |
| 6,967,863 B2 | 11/2005 | Huai |
| 6,979,586 B2 | 12/2005 | Guo |
| 6,985,378 B2 | 1/2006 | Kozicki |
| 6,985,385 B2 | 1/2006 | Nguyen |
| 6,992,359 B2 | 1/2006 | Nguyen |
| 6,998,150 B2 | 2/2006 | Li |
| 7,009,877 B1 | 3/2006 | Huai |
| 7,020,024 B2 | 3/2006 | Sim |
| 7,057,921 B2 | 6/2006 | Valet |
| 7,067,330 B2 | 6/2006 | Min |
| 7,067,866 B2 | 6/2006 | Shi |
| 7,088,609 B2 | 8/2006 | Valet |
| 7,088,624 B2 | 8/2006 | Daniel |
| 7,092,279 B1 | 8/2006 | Sheppard |
| 7,093,347 B2 | 8/2006 | Nowak |
| 7,098,494 B2 | 8/2006 | Pakala |
| 7,098,495 B2 | 8/2006 | Sun |
| 7,099,186 B1 | 8/2006 | Braun |
| 7,105,372 B2 | 9/2006 | Min |
| 7,110,284 B2 | 9/2006 | Hayakawa |
| 7,110,287 B2 | 9/2006 | Huai |
| 7,126,202 B2 | 10/2006 | Huai |
| 7,138,648 B2 | 11/2006 | Kneissl |
| 7,161,829 B2 | 1/2007 | Huai |
| 7,187,577 B1 | 3/2007 | Wang |
| 7,189,435 B2 | 3/2007 | Tuominen |
| 7,190,611 B2 | 3/2007 | Nguyen |
| 7,196,882 B2 | 3/2007 | Deak |
| 7,224,601 B2 | 5/2007 | Panchula |
| 7,230,265 B2 | 6/2007 | Kaiser |
| 7,230,845 B1 | 6/2007 | Wang |
| 7,233,039 B2 | 6/2007 | Huai |
| 7,241,631 B2 | 7/2007 | Huai |
| 7,241,632 B2 | 7/2007 | Vang |
| 7,242,045 B2 | 7/2007 | Nguyen |
| 7,242,048 B2 | 7/2007 | Huai |
| 7,245,462 B2 | 7/2007 | Huai |
| 7,272,034 B1 | 9/2007 | Chen |
| 7,272,035 B1 | 9/2007 | Chen |
| 7,274,057 B2 | 9/2007 | Worledge |
| 7,282,755 B2 | 10/2007 | Pakala |
| 7,285,836 B2 | 10/2007 | Ju |
| 7,286,395 B2 | 10/2007 | Chen |
| 7,289,356 B2 | 10/2007 | Diao |
| 7,345,912 B2 | 3/2008 | Luo |
| 7,366,009 B2 * | 4/2008 | Katti ............... 365/158 |
| 7,369,427 B2 | 5/2008 | Diao |
| 7,379,327 B2 | 5/2008 | Chen |
| 7,385,842 B2 | 6/2008 | Deak |
| 7,403,418 B2 | 7/2008 | Lin |
| 7,408,806 B2 | 8/2008 | Park |
| 7,411,815 B2 | 8/2008 | Gogl |
| 7,430,135 B2 | 9/2008 | Huai |
| 7,477,491 B2 | 1/2009 | Li |
| 7,480,173 B2 | 1/2009 | Guo |
| 7,485,503 B2 | 2/2009 | Brask |
| 7,486,551 B1 | 2/2009 | Li |
| 7,486,552 B2 | 2/2009 | Apaklov |
| 7,489,541 B2 | 2/2009 | Pakala |
| 7,495,867 B2 | 2/2009 | Sbiaa |
| 7,502,249 B1 | 3/2009 | Ding |
| 7,515,457 B2 | 4/2009 | Chen |
| 7,518,835 B2 | 4/2009 | Huai |
| 7,539,047 B2 | 5/2009 | Katti |
| 7,572,645 B2 | 8/2009 | Sun |
| 7,573,736 B2 | 8/2009 | Wang |
| 7,576,956 B2 | 8/2009 | Huai |
| 7,671,433 B2 * | 3/2010 | Sugahara et al. ............. 257/421 |
| 7,728,622 B2 | 6/2010 | Chua-Eoan et al. |
| 7,781,080 B2 | 8/2010 | Takenoiri |
| 2003/0011945 A1 | 1/2003 | Yuasa |
| 2003/0137864 A1 | 7/2003 | Holden |
| 2004/0008537 A1 | 1/2004 | Sharma |
| 2004/0084702 A1 | 5/2004 | Jeong |
| 2004/0090809 A1 | 5/2004 | Tran |
| 2004/0170055 A1 | 9/2004 | Albert |
| 2004/0179311 A1 | 9/2004 | Li |
| 2004/0197579 A1 | 10/2004 | Chen |
| 2005/0048674 A1 | 3/2005 | Shi |
| 2005/0068684 A1 | 3/2005 | Gill |
| 2005/0117391 A1 | 6/2005 | Yoda |
| 2005/0139883 A1 | 6/2005 | Sharma |
| 2005/0141148 A1 * | 6/2005 | Aikawa et al. ........... 360/324.11 |
| 2005/0150535 A1 | 7/2005 | Samavedam |
| 2005/0150537 A1 | 7/2005 | Ghoshal |
| 2005/0184839 A1 | 8/2005 | Nguyen et al. |
| 2005/0185459 A1 | 8/2005 | Fukuzumi |
| 2005/0237787 A1 | 10/2005 | Huai et al. |
| 2005/0254286 A1 | 11/2005 | Valet |
| 2005/0269612 A1 | 12/2005 | Torok |
| 2005/0275003 A1 | 12/2005 | Shinmura |
| 2005/0282379 A1 | 12/2005 | Saito |
| 2006/0049472 A1 | 3/2006 | Diao |
| 2006/0060832 A1 | 3/2006 | Symanczyk |
| 2006/0061919 A1 | 3/2006 | Li |
| 2006/0083047 A1 | 4/2006 | Fujita |
| 2006/0141640 A1 | 6/2006 | Huai |
| 2006/0171199 A1 | 8/2006 | Ju |
| 2006/0233017 A1 | 10/2006 | Hosotami |
| 2006/0245117 A1 | 11/2006 | Nowak |
| 2007/0002504 A1 | 1/2007 | Huai et al. |
| 2007/0007609 A1 | 1/2007 | Saito |
| 2007/0008661 A1 | 1/2007 | Min |
| 2007/0025164 A1 | 2/2007 | Kim |
| 2007/0029630 A1 | 2/2007 | Seyyedy |
| 2007/0035890 A1 | 2/2007 | Sbiaa |
| 2007/0047294 A1 | 3/2007 | Panchula |
| 2007/0054450 A1 | 3/2007 | Hong |
| 2007/0063237 A1 | 3/2007 | Huai |
| 2007/0064352 A1 | 3/2007 | Gill |
| 2007/0069314 A1 | 3/2007 | Wilson |
| 2007/0085068 A1 | 4/2007 | Apakov |
| 2007/0096229 A1 | 5/2007 | Yoshikawa |
| 2007/0120210 A1 | 5/2007 | Yuan |
| 2007/0132049 A1 | 6/2007 | Stipe |
| 2007/0133251 A1 * | 6/2007 | Carey et al. ................. 365/129 |
| 2007/0164380 A1 | 7/2007 | Min |

(56) References Cited

U.S. PATENT DOCUMENTS

| | | |
|---|---|---|
| 2007/0171694 A1 | 7/2007 | Huai |
| 2007/0230233 A1 | 10/2007 | Takahashi |
| 2007/0241392 A1 | 10/2007 | Lin |
| 2007/0246787 A1 | 10/2007 | Wang |
| 2007/0297220 A1 | 12/2007 | Yoshikawa |
| 2008/0026253 A1 | 1/2008 | Yuasa |
| 2008/0037179 A1* | 2/2008 | Ito et al. .................. 360/313 |
| 2008/0055792 A1* | 3/2008 | Zheng et al. ............ 360/324.2 |
| 2008/0061388 A1 | 3/2008 | Diao |
| 2008/0130354 A1 | 6/2008 | Ho |
| 2008/0179699 A1 | 7/2008 | Horng |
| 2008/0180991 A1 | 7/2008 | Wang |
| 2008/0191251 A1 | 8/2008 | Ranjan |
| 2008/0258247 A1 | 10/2008 | Mancoff |
| 2008/0265347 A1 | 10/2008 | Iwayama |
| 2008/0273380 A1 | 11/2008 | Diao |
| 2008/0277703 A1 | 11/2008 | Iwayama |
| 2008/0291721 A1 | 11/2008 | Apalkov |
| 2008/0310213 A1 | 12/2008 | Chen |
| 2008/0310219 A1 | 12/2008 | Chen |
| 2009/0027810 A1 | 1/2009 | Horng |
| 2009/0040855 A1 | 2/2009 | Luo |
| 2009/0050991 A1 | 2/2009 | Nagai |
| 2009/0073756 A1 | 3/2009 | Yang |
| 2009/0185410 A1 | 7/2009 | Huai |
| 2009/0218645 A1 | 9/2009 | Ranjan |
| 2009/0257154 A1 | 10/2009 | Carey et al. |
| 2009/0296454 A1 | 12/2009 | Honda |
| 2009/0302403 A1 | 12/2009 | Nguyen |
| 2010/0034009 A1 | 2/2010 | Lu |
| 2010/0118600 A1 | 5/2010 | Nagasi |
| 2010/0176471 A1 | 7/2010 | Zhu |

OTHER PUBLICATIONS

Berger, Emission of Spin Waves by Magnetic Multilayer Traversed by a Current, Physic. Review B 54, 9353 (1996).
Black et al., Programmable Logic Using Giant Magnetoresistance and Spin-Dependent Tunneling Devices (Invited), J. Appl. Phys. 87, 6674 (2000).
Chu et al., Fabrication of Ideally Ordered Nanoporous Alumina Films and Integrated Alumina Nanotubule Arrays by High-Field Anodization, Adv. Mater. 2005, 17, 2115-2119.
Cowburn et al., Room Temperature Magnetic Quantum Cellular Automata, Science 287, 1466 (2000).
de Groot et al., New Class of Materials: Half-Metallic Ferromagnets, Physics Review Letters, 50, 2024 (1983).
Egelhoff et al., Oxygen as a Surfactant in the Growth of Giant Magnetoresistance Spin Valves, Journal of Applied Physics 82 (12), Dec. 15, 1997.
Emley, N.C., et al., Reduction of Spin Transfer by Synthetic Antiferromagnets, Applied Physics Letters, May 24, 2004, pp. 4257-4259, vol. 84, No. 21.
Folk et al., A Gate-Controlled Bidirectional Spin Filter Using Quantum Coherence, Science, vol. 299, Jan. 31, 2003, pp. 679-682.
Hayakawa et al., Current-Induced Magnetization Switching in MgO Barrier Based Magnetic Tunnel Junctions with CoFeB/Ru/CoFeB Synthetic Ferrimagnetic Free layer, Japanese Journal of Applied Physics, vol. 45, No. 40, 2006, pp. L1057-L1060.
Huczko, Template-Based Synthesis of Nanomaterials, Appl. Phys. A 70, 365-376 (2000).
Kawahara et al., 2Mb Spin-Transfer Torque RAM (SPRAM) with Bit-by-Bit Bidirectional Current Write and Parallelizing-Direction Current Read, ISSCC 2007, Section 26, Non-Volatile Memories/26.5.
Korenivski, et al., Thermally Activated Switching in Spin-Flop Tunnel Junctions, Applied Physics Letters 86, 252506 (2005).
Li et al., Role of Oxygen Exposure in Different Positions in the Synthetic Spin Valves, Journal of Applied Physics, vol. 93, No. 10, May 15, 2003.
Macak et al., High-Aspect-Ratio $TiO_2$, Nanotubes by Anodization of Titanium, Angew. Chem. Int. Ed. 2005, 44, 2100-2102.
Masuda and Kenji Fukuda, Science, 268, 1466 91995).
Masuda et al., Ordered Metal Nanohole Arrays Made by a Two-Step Replication of Honeycomb Structures of Anodic Alumina, Science, OI. 268, Jun. 9, 1995.
Meng et al., A Spintronics Full Adder for Magnetic CPU, IEEE Elec. Dev. Lett. 26, 360 (2005).
Meng et al., Spin Transfer in Nanomagnetic Devices with Perpendicular Anistropy, Applied Physics Letters 88, 172506 (2006).
Miura et al., A Novel SPRAM (Spin Transfer Torque RAM) with a Synthetic Ferrimagnetic Free Layer . . . , VLSI Symposium on VLSI Tech. Digest of Technical Papers (2007).
Ney et al., Programmable Computing with a Single Magnetoresistance Element, Nature 425, 485 (2003).
PCT Search Report and Written Opinion dated Oct. 4, 2010.
PCT Search Report and Written Opinion dated Mar. 10, 2010.
PCT Search Report and Written Opinion dated Mar. 22, 2010.
Prejbeanu et al., Thermally Assisted MRAM, J. Phys. Condens. Matter 19 (2007) 165218 (23 pp).
Seki et al., Spin-Polarized Current-Induced Magnetization Reversal in Perpendicularly Magnetized L1o-FePt Layers, Applied Physics Letters 88, 172504 (2006).
Sharrock, Time Dependence of Switching Fields in Magnetic Recording Media (Invited), J. Appl. Phys. 76 (10), Nov. 15, 1994.
Slonczewski et al., Current-Driven Excitation of Magnetic Multilayers, Journal of Magnetism and Magnetic Materials 159 (1996) L1-L7.
Sun, "Spin-Current Interaction with a Monodomain Magnetic Body: A Model Study", Physical Review B, vol. 62, No. 1, (2000), pp. 570-578.
Sun, Current-Driven Magnetic Switching in Manganite Trilayer Junctions, Journal of Magnetism and Magnetic Materials 202 (1999) 157-162.
Thurn-Albrecht et al., Science, 290, 2126 (2000).
U.S. Appl. No. 12/416,976, filed Apr. 2, 2009, Inventor: Zheng.
U.S. Appl. No. 12/106,382, filed Apr. 21, 2008, Inventors: Xi et al.
U.S. Appl. No. 12/125,975, filed May 23, 2008, Inventor: Xi.
U.S. Appl. No. 12/126,014, filed May 23, 2008, Inventor: Xiaohua Lou.
U.S. Appl. No. 12/170,519, filed Jul. 10, 2008, Inventors: Xi et al.
U.S. Appl. No. 12/175,545, filed Jul. 18, 2008, Inventor: Lou.
U.S. Appl. No. 12/239,882, filed Sep. 29, 2008, Inventor: Zheng et al.
U.S. Appl. No. 12/239,887, filed Sep. 29, 2008; Inventor: Zheng.
U.S. Appl. No. 12/258,476, filed Oct. 27, 2008, Inventor: Lou.
U.S. Appl. No. 12/258,491, filed Oct. 27, 2008, Inventor: Lou.
U.S. Appl. No. 12/258,492, filed Oct. 27, 2008, Inventor: Lou.
U.S. Appl. No. 12/269,507, filed Nov. 12, 2008, Inventor: Tian.
U.S. Appl. No. 12/269,514, filed Nov. 12, 2008, Inventor: Venkatasamy.
U.S. Appl. No. 12/269,537, filed Nov. 12, 2008, Inventor: Tang et al.
U.S. Appl. No. 12/396,905, filed Mar. 3, 2009, Inventor: Gao.
U.S. Appl. No. 12/398,214, filed Mar. 5, 2009, Inventor: Wang et al.
U.S. Appl. No. 12/425,457, filed Apr. 17, 2009, Inventor: Gao.
Vurgaftman et al., Spin-Polarizing Properties of the InAs/(AISb)/GaMnSb/(AlSb/InAs Ferromagnetic Resonant Interband Tunneling Diode, Physical Review B 67, 12509 (2003).
Wendt et al., Electronic and Vibrational Properties of Ultrathin $SiO_2$ Films Grown on Mo(112), 2005, Phys. Rev. vol. B72, pp. 1150409-1-115409.0.
Yan et al., Magnesium Oxide as a Candidate High-k Gate Dielectric, 2006, Applied Physics Lett. vol. 88, pp. 142901-1-142901-3.
Yen et al., Reduction in Critical Current Density for Spin Torque Transfer Switching with Composite Free Layer, Applied Physics Letters 93, 092504 (2008).
Zheng et al., Low Switching Current Flux-Closed Magnetoresistive Random Access Memory, Journal of Applied Physics, May 15, 2003.
Zheng et al., Magnetic Random Access Memory (MRAM), Journal of Nanoscience and Nanotechnology, vol. 7, 117-137 (2007).
Zhuang et al., Tech Dig. IEDM (2002) 193.

* cited by examiner

WRITE-ONCE MAGENTIC JUNCTION MEMORY ARRAY

BACKGROUND

Today's computer systems and portable electronics are becoming increasingly sophisticated, permitting users to perform an ever increasing variety of computing tasks at faster and faster rates. The size of the memory and the speed at which it can be accessed bear heavily upon the overall speed of the computer or portable electronic system.

Memory is technically any form of electronic, magnetic or optical storage; however it is generally divided up into different categories based in part upon speed and functionality. Depending on the read and write characteristics, memory can be divided into two categories, random access memory and read-only memory. Read-only memory is also known as write-once memory.

Generally, the principle underlying the storage of data in a magnetic media is the ability to change, and or reverse, the relative orientation of the magnetization (i.e., magnetization orientation) of a storage data bit (i.e., the logic state of a "0" or a "1"). The coercivity of a material is the level of demagnetizing force that must be applied to a magnetic particle to reduce and or reverse the magnetization of the particle. Generally speaking, the smaller the magnetic particle the higher it's coercivity.

With respect to magnetic memory components, it is known that as size decreases coercivity increases. A large coercivity is generally undesirable as it requires a greater electrical field to be switched, which in turn requires a greater power source and potentially larger conductor. Providing large power sources and large conductors is generally at odds with the focus of nanotechnology to reduce the necessary size of components. In addition, to mitigate the potential of inadvertently switching a neighboring memory cell, nanometer scaled memory cells are generally more widely spaced relative to their overall size than are non-nanometer sized memory cells. Moreover, as the size of the magnetic memory decreases, the unused space between individual memory cells tends to increase.

BRIEF SUMMARY

The present disclosure relates to magnetic junction memory arrays and methods of using the same. Data is written to a free layer of the magnetic junction by an external magnetic filed imposed by a write head and the data is read out as either a high or low resistance of the magnetic junction. Thus, the magnetic junction memory array includes read circuitry but does not include write circuitry.

In one particular embodiment, a magnetic junction memory array includes a plurality of electrically conductive word lines extending in a first direction, a plurality of electrically conductive bit lines extending in a second direction and forming a cross-point array with the plurality of electrically conductive word lines, and a memory cell proximate to, at least selected, cross-points forming a magnetic junction memory array. Each memory cell includes a magnetic pinned layer electrically between a magnetic bit and an isolation transistor. The isolation transistor has a current source and a gate. The current source is electrically coupled to the bit line and the gate is electrically coupled to the word line. An electrically conductive cover layer is disposed on and in electrical communication with the magnetic bits.

BRIEF DESCRIPTION OF THE DRAWINGS

The invention may be more completely understood in consideration of the following detailed description of various embodiments of the invention in connection with the accompanying drawings, in which.

The figures are not necessarily to scale. Like numbers used in the figures refer to like components. However, it will be understood that the use of a number to refer to a component in a given figure is not intended to limit the component in another figure labeled with the same number.

DETAILED DESCRIPTION

In the following description, reference is made to the accompanying set of drawings that form a part hereof and in which are shown by way of illustration several specific embodiments. It is to be understood that other embodiments are contemplated and may be made without departing from the scope or spirit of the present invention. The following detailed description, therefore, is not to be taken in a limiting sense. The definitions provided herein are to facilitate understanding of certain terms used frequently herein and are not meant to limit the scope of the present disclosure.

Unless otherwise indicated, all numbers expressing feature sizes, amounts, and physical properties used in the specification and claims are to be understood as being modified in all instances by the term "about." Accordingly, unless indicated to the contrary, the numerical parameters set forth in the foregoing specification and attached claims are approximations that can vary depending upon the desired properties sought to be obtained by those skilled in the art utilizing the teachings disclosed herein.

The recitation of numerical ranges by endpoints includes all numbers subsumed within that range (e.g. 1 to 5 includes 1, 1.5, 2, 2.75, 3, 3.80, 4, and 5) and any range within that range.

As used in this specification and the appended claims, the singular forms "a", "an", and "the" encompass embodiments having plural referents, unless the content clearly dictates otherwise. As used in this specification and the appended claims, the term "or" is generally employed in its sense including "and/or" unless the content clearly dictates otherwise.

A typical magnetic junction memory array is formed from a plurality of memory cells, each of which has a magnetic memory element or magnetic junction and a select device such as transistor. The magnetic junction is disposed between a bit line and a word line. One method of writing to the magnetic junction memory array is to apply a write current to the bit line to generate a magnetic field large enough to switch the direction or orientation of magnetization of the free layer of the magnetic junction and thus write to the desired memory cell. Depending upon the data written to the memory cell, the magnetic junction, will have a high resistance or a low resistance. To read from the memory cell, a read current is applied through the magnetic junction and the output voltage or resistance across the cell is read.

Although this write method can function adequately, there are barriers to the use of the magnetic junction elements at higher memory cell densities. For example, the magnetization orientation of the magnetic junction free layer is switched by the external magnetic field generated by the current driven through the bit line and the write line. The magnetic field required to switch the magnetization orientation of the free layer, known as the switching field, is inversely proportional to the width of the magnetic element. As a result, the switching field increases with smaller magnetic elements. Because the switching field is higher, the current required increases. This large current can cause various problems. For example, cross talk and power consumption increases. The driving circuits required to drive the current that generates the switching field increases in area and complexity. Additionally, the write currents have to be large enough to switch a magnetic memory cell but not so large that the neighboring cells are inadvertently switched. This upper limit on the write current can lead to writeability issues because the cells that are harder to switch than others (due to fabrication and material nonuniformity) may fail to write consistently.

The present disclosure relates to magnetic junction memory and methods of using the same. While the described magnetic junction memory can be utilized as any type of memory, it is particularly useful as write-once memory or read-only memory. Writing to the memory can be done with a write head storing data in patterned magnets associated with the magnetic junctions. The data (i.e., magnetization orientation of the patterned magnet) is read out as the resistance of the magnetic junction. Data is written to a free layer of the magnetic junction by an external magnetic filed imposed by a write head and the data is read out as either a high or low resistance of the magnetic junction. Thus, the magnetic junction memory array includes read circuitry but does not include write circuitry. While the present invention is not so limited, an appreciation of various aspects of the invention will be gained through a discussion of the examples provided below.

In one particular embodiment, a magnetic junction memory array includes a plurality of electrically conductive word lines extending in a first direction, a plurality of electrically conductive bit lines extending in a second direction and forming a cross-point array with the plurality of electrically conductive word lines, and a memory cell proximate to, at least selected, cross-points forming a magnetic junction memory array. Each memory cell includes a magnetic pinned layer electrically between a magnetic bit and an isolation transistor. The isolation transistor has a current source and a gate. The current source is electrically coupled to the cross-point bit line and the gate is electrically coupled to the cross-point word line. An electrically conductive cover layer is disposed on and in electrical communication with the magnetic bits.

In another embodiment, a memory writing apparatus includes a probe having a magnetic field data writing head, a stage disposed adjacent to the probe, and an x-y plane actuator coupled to the probe or the platform. The x-y plane actuator provides relative x-y plane movement between the probe and the stage. A magnetic junction memory array is interchangeably disposed on the stage. The magnetic junction memory array includes a plurality of electrically conductive word lines extending in a first direction, a plurality of electrically conductive bit lines extending in a second direction and forming a cross-point array with the plurality of electrically conductive word lines. A memory cell is proximate to, at least selected, cross-points forming a magnetic junction memory array. Each memory cell has a magnetic pinned layer between a magnetic bit and an isolation transistor. The isolation transistor includes a current source and a gate. The current source is electrically coupled to the cross-point bit line and the gate is electrically coupled to the cross-point word line. An electrically conductive cover layer is disposed on and in electrical communication with the magnetic bits. The electrically conductive cover layer is between the magnetic field data writing head and the magnetic bit.

In a further embodiment, a method includes providing a magnetic junction memory array having a plurality of electrically conductive word lines extending in a first direction, a plurality of electrically conductive bit lines extending in a second direction and forming a cross-point array with the plurality of electrically conductive word lines, and a memory cell proximate to, at least selected, cross-points forming a magnetic junction memory array. Each memory cell has a magnetic pinned layer between a magnetic bit and an isolation transistor. The isolation transistor includes a current source and a gate. The current source is electrically coupled to the cross-point bit line and the gate is electrically coupled to the cross-point word line. An electrically conductive cover layer is disposed on and in electrical communication with the magnetic bits. The method then includes writing data to the magnetic bits with a magnetic field data writing head. The magnetic field data writing head is movable relative to the magnetic junction memory array.

Figure 1:
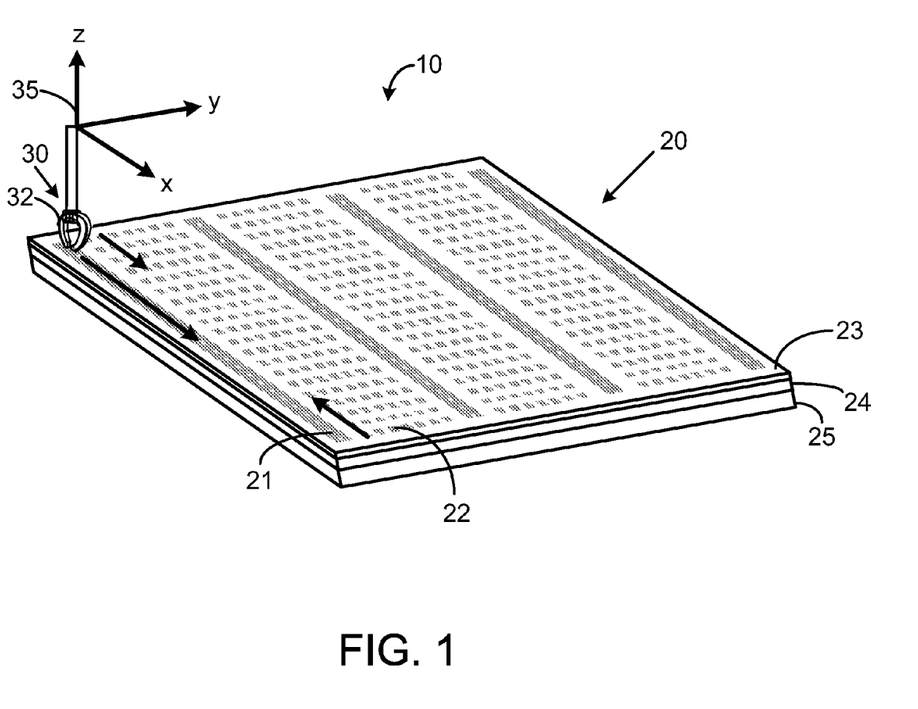
FIG. 1 is a schematic perspective view of an illustrative memory writing apparatus.

FIG. 1 is a schematic perspective view of an illustrative memory writing apparatus 10. The memory writing apparatus 10 includes a probe 30 having a magnetic field data writing head 32. A stage 25 disposed adjacent to the probe 30. An x-y plane actuator 35 is coupled to the probe 30 (as illustrated) or the platform 25. The x-y plane actuator 35 provides relative x-y plane movement between the probe 30 and the stage 25. In many embodiments, the x-y plane actuator 35 can also provide height adjustment (z-axis) between the probe 30 and the stage 25. In many embodiments, the magnetic field data writing head 32 has a cross-sectional area similar to a cross-sectional area of each individual magnetic bit 22. This cross-sectional area is any useful area such as, for example, from 100 to 1000 nm$^2$ or from 200 to 500 nm$^2$. The magnetic bits 22 are magnetically soft ferromagnetic elements that each has a freely switchable magnetic orientation.

A magnetic junction memory array 20 is interchangeably disposed on the stage 25. That is, the magnetic junction memory array 20 is removable from the stage 25 and memory writing apparatus 10 so that another magnetic junction memory array can be placed in the memory writing apparatus 10. A bottom cover layer of the magnetic junction memory array 20 is not depicted, but may be present.

In many embodiments, the magnetic junction memory array 20 includes a servo code track 21. The servo code track 21 serves to register the probe 30 magnetic field data writing head 32 on track for accurate data writing and writing track registration. This process can be termed "pre-acquisition." A read gate of the probe 30 is turned on so that a read head 32 can sense the servo code track 21 magnetic field generated by the servo code track 21 and move along the servo track 21 (+x direction). This pre-acquisition process is further described below with regard to FIG. 5A, FIG. 5B and FIG. 5C. Before the write process begins, the magnetic junction memory array 20 can be exposed to a magnetic field to align the magnetization orientation M1 or M2 of the magnetic bits 22 in one direction, as desired.

Following the pre-acquisition process the write head 32 moves to the data track next to the servo track 21 by a predetermined distance and then moves along the data track and writes data to the patterned magnetic bits 22 along the data track (in a −x direction). At the end of the first data track the write head 32 moves to the next data track by a predetermined distance and then moves along the next data track and writes data to the patterned magnetic bits 22 along the data track (in a +x direction).

Figure 6:
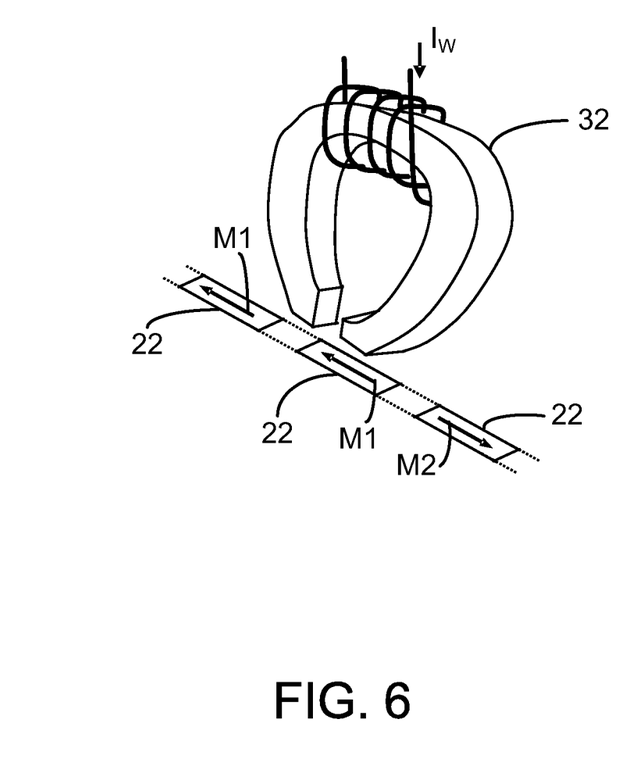
FIG. 6 is a schematic perspective view of a magnetic field write head writing data to the magnetic bits of the illustrative magnetic junction memory array.

FIG. 6 is a schematic perspective view of a magnetic field write head 32 writing data to the magnetic bits 22 of the illustrative magnetic junction memory array 20. Write current $I_W$ is applied to the magnetic write head 32 to switch or flip the magnetization orientation (i.e., M1 to M2 or M2 to M1) of the magnetic bits 22, as desired. The timing of the magnetic filed generated by the magnetic write head 32 is in correspondence to the distance of the magnetic bits along the data track.

Referring back to FIG. 1, the magnetic junction memory array 20 includes an electrically conductive cover or protective layer 23. This cover layer 23 is disposed upon and in electrical communication with the magnetic bits 22, and servo code track 21, when present. The cover layer 23 is disposed between the magnetic bits 22 and the probe 30 magnetic field data writing head 32. The cover layer 23 is thick enough (z-direction) to protect the magnetic bits 22, and servo code track 21 from damage, but thin enough to allow the magnetic field data writing head 32 generated a magnetic field to write data to the soft magnetic bits 22 and to allow the read head on the probe 30 to sense the generated magnetic field of the servo code track 21. In many embodiments, the cover layer 23 is formed from a metal and has a thickness in a range from 10 to 500 nm or from 10 to 250 nm or from 20 to 250 nm. The cover layer 23 is grounded 26 or electrically coupled to a current drain 26 as described below with regard to FIG. 2. The magnetic junction memory array 20 is disposed within a medium layer 24. Details of the magnetic junctions are provided below in reference to FIG. 2, FIG. 3, and FIG. 4. The medium layer 24 is between the cover layer 23 and the stage 25 or optional bottom cover layer of the magnetic junction memory array 20.

The magnetic bits 22 can be provided on the magnetic junction memory array 20 in any useful density or pattern. In many embodiments, the magnetic bits 22 are spaced from one another by a distance in a range of from 10 nm to 100 nm, or from 10 nm to 50 nm, or form 10 nm to 40 nm. Each magnetic bit 22 permits storage of a bit of data as an alterable magnetization orientation either M1 or M2. One orientation is a high resistance state orientation and the other orientation is a low resistance state orientation. The magnetic bits 22 are magnetically soft and separated from one another by a certain distance described above. Thus, the magnetic field required to switch or flip the data bits 22 can be relatively small.

When data writing is complete, the magnetic field write head 32 is disengaged and removed from the writing apparatus 10 and utilized as read-only memory, as desired. If desired, the written to magnetic junction memory array can be placed into the memory writing apparatus 10 and re-written to, as desired.

Figure 2:
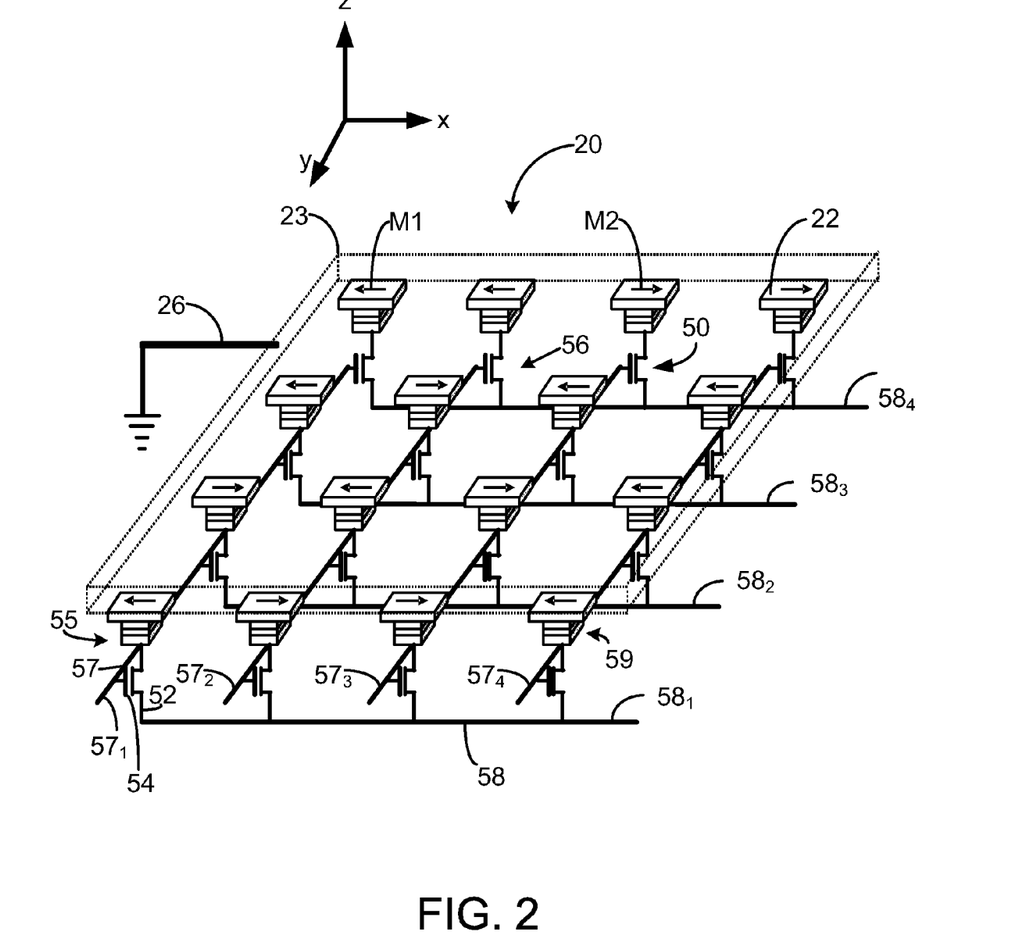
FIG. 2 is a schematic perspective view of an illustrative magnetic junction memory array.
Figure 3:
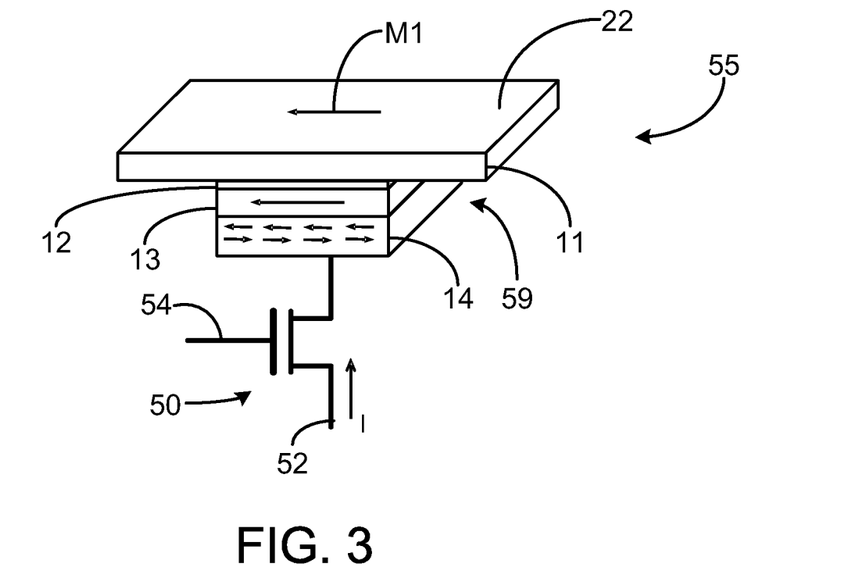
FIG. 3 is a schematic perspective view of an illustrative magnetic junction memory cell.
Figure 4:
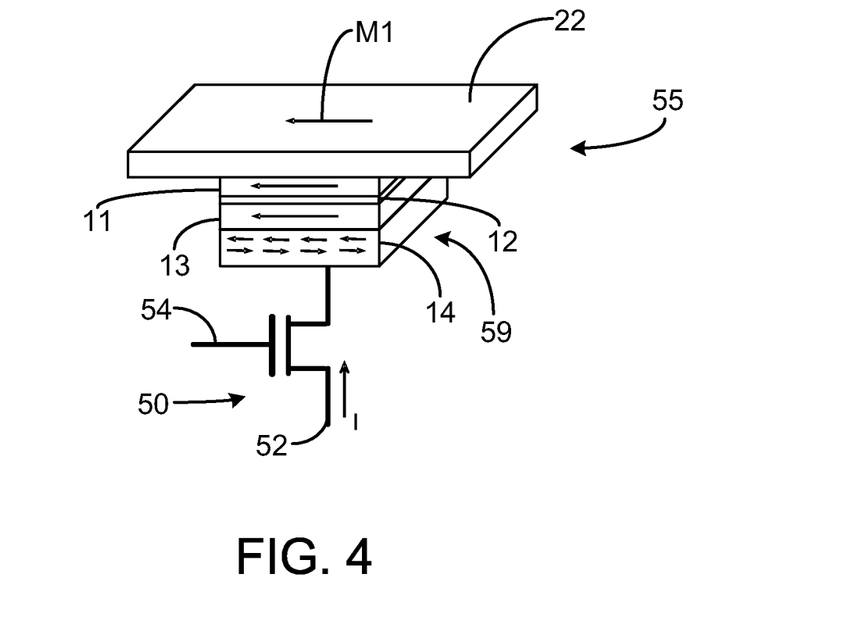
FIG. 4 is a schematic perspective view of another illustrative magnetic junction memory cell.

FIG. 2 is a schematic perspective view of an illustrative magnetic junction memory array 20. FIG. 3 and FIG. 4 are schematic perspective views of alternate illustrative magnetic junction memory cells 55. The magnetic junction memory array 20 includes a plurality of electrically conductive word lines 57 (denoted as $57_1$, $57_2$, $57_3$, $57_4$) extending in a first direction (y direction). While only four parallel word lines 57 are illustrated in FIG. 2, it is understood that the magnetic junction memory array 20 can include any useful number of word lines 57 such as, for example, hundreds, thousands, or millions, etc., of word lines 57.

A plurality of electrically conductive bit lines 58 (denoted as $58_1$, $58_2$, $58_3$, $58_4$) extend in a second direction (x direction) and form a cross-point 56 array with the plurality of electrically conductive word lines 57. In many embodiments, the bit lines 58 are orthogonal to the word lines 57. While only four parallel bit lines 58 are illustrated in FIG. 2, it is understood that the magnetic junction memory array 20 can include any useful number of bit lines 58 such as, for example, hundreds, thousands, or millions, etc., of bit lines 58. The bit lines 58 are connected to a supply voltage for reading the data stored in each memory cell 55. When a memory cell 55 is selected and the bit line $58_1$, for example, is biased at a certain voltage in read operation, the current is applied through the bit line $58_1$ and passes through the magnetic junction 59 and the magnetic bit 22 and into the metallic cover plate 23, which is grounded 26. The current amplitude reveals the junction resistance and thus the data state of the selected magnetic bit 22, and thus completing the read operation.

FIG. 2 illustrates a four by four array of sixteen memory cells 55. Each memory cell 55 is proximate to, at least selected, cross-points 56 forming the magnetic junction memory array 20. Each memory cell 55 includes a magnetic pinned layer 13 between a magnetic bit 22 and an isolation transistor 50. The cover layer 23 is illustrated as a transparent layer in FIG. 2 for ease of illustration of the underlying magnetic junction array. As described above, the cover layer 23 is a thin electrically conducting layer (i.e., metal) and is disposed upon and in electrical communication with the magnetic bits 22 and in electrical communication with a ground 26 or current drain.

The isolation transistor 50 includes a current source 52 and a gate 54, as is known in the art. The current source 52 is electrically coupled to the cross-point bit line 58 (denoted as $58_1$ for example) and the gate 54 is electrically coupled to the cross-point word line 57 (denoted as $57_1$ for example).

FIG. 3 and FIG. 4 further describe the memory cell 55 and magnetic junction 59. In FIG. 3 the magnetic bit 22 forms a free layer 11 of the magnetic junction 59. FIG. 4 illustrates a separate free layer 11 magnetically coupled to the magnetic bit 22. The separate free layer 11 is also magnetically soft so its magnetization orientation aligns with the magnetic bit 22.

The magnetic junction 59 includes an insulating or barrier layer 12 disposed between a fixed magnetic layer or pinned layer 13 and a freely switchable layer or free layer 11. The magnetic junction 59 stores information in states of "00" or "01," each representing a current or resistance difference of the magnetic junction 59 occurring when inverting a magnetic moment of the freely switchable magnetic layer while fixing the magnetic moment of the fixed magnetic layer. This digital state can be constantly maintained unless an external magnetic field exceeding an anti-magnetic field of the freely switchable magnetic layer is exerted.

FIG. 3 and FIG. 4 illustrate the magnetic junction 59 including a pinned layer 13 between the free layer 11 and a pinning layer 14. A barrier layer 12 is disposed between the free layer 11 and the pinned layer 13. The barrier layer 12 is an electrically conductive, non-magnetic layer. The pinned layer 13 can be a single layer or a synthetic-antiferromagnetic-coupled structure, and is pinned by a pinning layer 14 below it. The arrows show the magnetization orientation of each of the layers. When the magnetization orientation of the free layer 11 and the pinned layer 13 is in parallel configuration, the junction resistance is lowest (data state "00" for example). When the magnetization orientation of the free layer 11 and the pinned layer 13 is in an opposing configuration (i.e., anti-parallel), the junction resistance is highest (data state "01" for example). Thus, the state of the data can be read out by passing a current through the junction and measuring the junction resistance.

Since the magnetic junction 59 contributes the majority of the resistance across the memory cell 55 and the magnetoresistance ratio of the memory cell, the resistance of the cell is determined, in large part, by the magnetization orientation M1 or M2 of the free layer 11 and pinned layer 13. Because the pinned layer 13 has its magnetization orientation fixed, changes in the magnetization orientation M1 or M2 of magnetic bit 22 and hence the free layer 11 will change the resistance and the logic bit state of memory cell 55. Reading current I applied through the isolation transistor 50, magnetic junction 59 to the conductive cover plate and ground 26, can be read as either a high resistance state M2 or a low resistance state M1 (utilizing the pinned magnetization orientation illustrated in FIG. 3 and FIG. 4). The read current I or voltage applied across the memory cell 55 can be any useful reading current or voltage such as, for example, from 0.5 to 3.5 V.

Figure 5A:
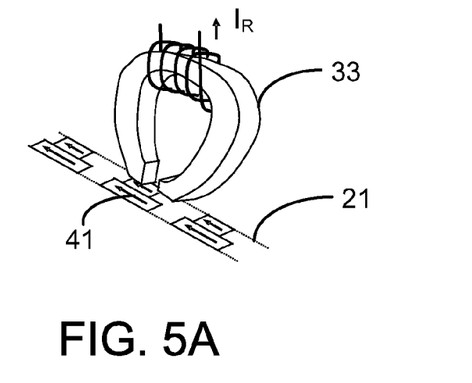
FIG. 5A is a schematic perspective view of an illustrative magnetic ring head on a servo code track.
Figure 5B:
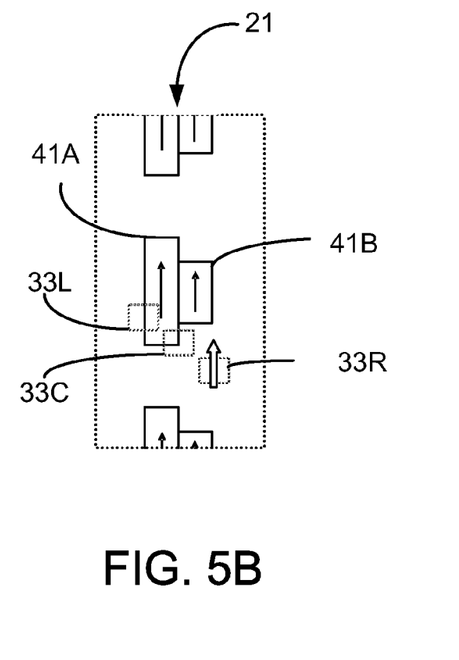
FIG. 5B and FIG. 5C are schematic top views of two illustrative embodiments of servo code tracks.
Figure 5C:
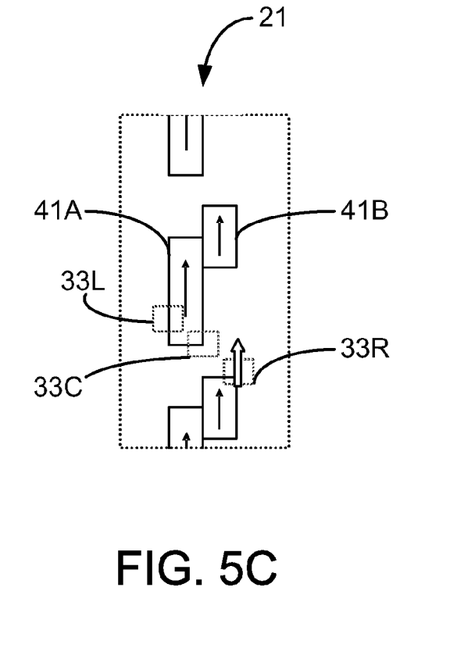

FIG. 5A is a schematic perspective view of an illustrative magnetic ring read head 33 on a servo code track 21. FIG. 5B and FIG. 5C are schematic top views of two illustrative embodiments of servo code tracks 21. The servo code track 21 includes a plurality of patterned permanent magnetic bits 41 proximate to magnetic junction magnetic bits 22. The servo code track 21 provides track registration for the magnetic field data writing head 32 (shown in FIG. 1). While a magnetic ring read head 33 is illustrated, any useful magnetic field sensing element can be utilized to sense the servo code track 21 magnetic field and provide track registration for the magnetic field data writing head 32. A read current $I_R$ is provided by the illustrated magnetic ring read head 33, depending on the relative location of the magnetic ring read head 33 to the servo code track 21.

The servo code track 21 includes a plurality of pairs 41A, 41B of permanent magnets 41 with their magnetization orientation aligned in a down-track direction, for example. These magnets 41 can be any useful shape such as, for example, a rectangle or ellipse with the long axis aligned in a down-track direction. Each magnet 41A, 41B has a different magnetic length and can be spaced relative to each other as illustrated in FIG. 5B and FIG. 5C. By analyzing the sensed magnetic field of the each magnet 41 pair 41A, 41B, the read head 33 knows where it is relative to the servo track center 33C and position adjustment from either a right servo track position 33R or a left servo track position 33L is made. While two servo code tracks are illustrated, the servo code pattern is not limited to these illustrated servo code patterns.

Figure 7:
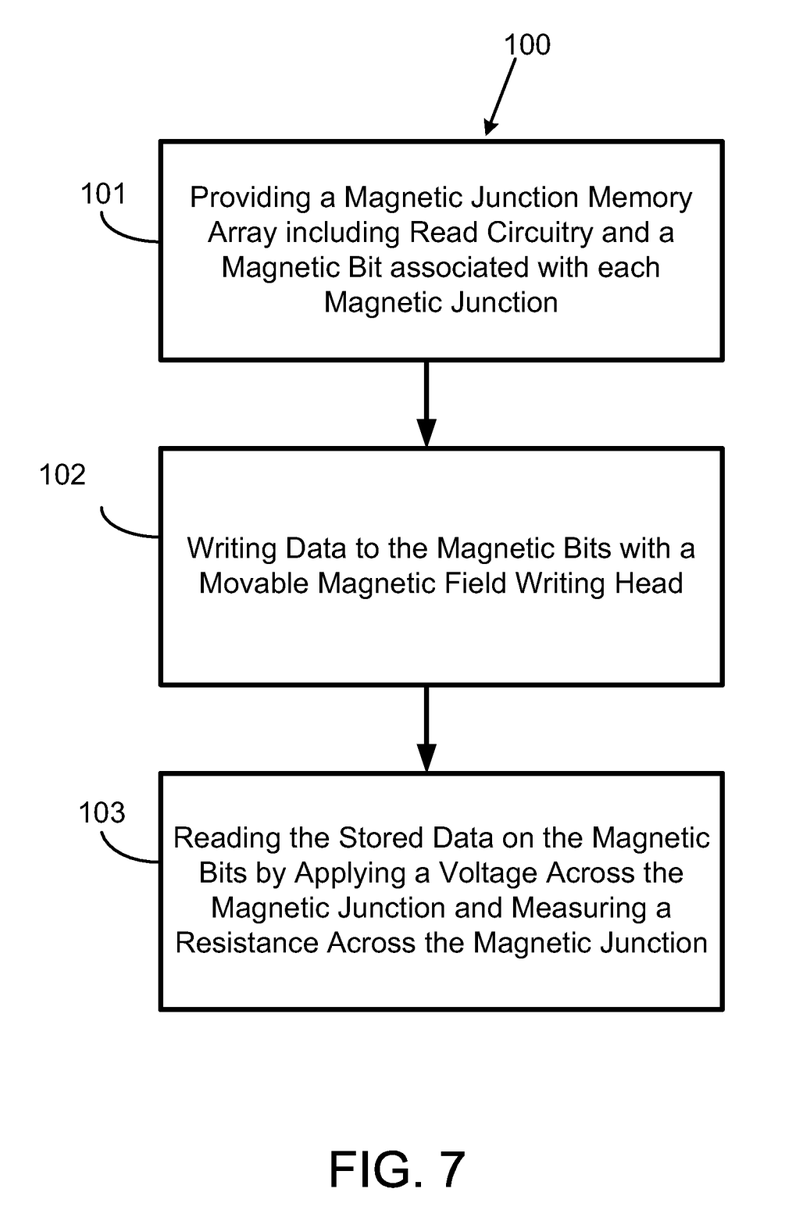
FIG. 7 is a flow diagram of an illustrative method utilizing the magnetic junction memory array disclosed herein.

FIG. 7 is a flow diagram 100 of an illustrative method utilizing the magnetic junction memory array disclosed herein. The method includes at block 101 providing a magnetic junction memory array including read circuitry and a magnetic bit associated with each magnetic junction. Then at block 102 the method includes writing data to the magnetic bits with a movable magnetic field writing head. At block 103 the method further includes reading the stored data on the magnetic bits by applying a voltage across the magnetic junction and measuring a resistance across the magnetic junction.

The method can also include providing a servo code track with the magnetic junction memory array. The servo code track includes a plurality of patterned permanent magnetic bits proximate to magnetic junction magnetic bits. The servo code track is read by a magnetic field read head coupled to the magnetic filed writing head and provides track registration for the magnetic field data writing head.

The magnetic junction memory arrays described herein can be formed with conventional semiconductor fabrication techniques.

Thus, embodiments of the MAGNETIC JUNCTION MEMORY ARRAY are disclosed. The implementations described above and other implementations are within the scope of the following claims. One skilled in the art will appreciate that the present invention can be practiced with embodiments other than those disclosed. The disclosed embodiments are presented for purposes of illustration and not limitation, and the present invention is limited only by the claims that follow.

What is claimed is:

1. A magnetic junction memory array, comprising:
a plurality of electrically conductive word lines extending in a first direction;
a plurality of electrically conductive bit lines extending in a second direction and forming a cross-point array with the plurality of electrically conductive word lines;
a memory cell proximate to, at least selected, cross-points forming a magnetic junction memory array, each memory cell comprising a magnetic pinned layer electrically between a magnetic bit and an isolation transistor, the isolation transistor comprising a current source and a gate, the current source is electrically coupled to the bit line and the gate is electrically coupled to the word line; and
an electrically conductive cover layer disposed on and in electrical communication with the magnetic bits.

2. A magnetic junction memory array according to claim 1, wherein the electrically conductive cover layer is in electrical communication with a current drain.

3. A magnetic junction memory array according to claim 1, wherein the electrically conductive cover layer has a thickness in a range from 20 nanometers to 250 nanometers.

4. A magnetic junction memory array according to claim 1, further comprising a servo code track comprising a plurality of patterned permanent magnetic bits proximate to the memory cell magnetic bits.

5. A magnetic junction memory array according to claim 1, wherein the magnetic bit forms a free layer of a magnetic junction and the magnetic junction comprises the magnetic pinned layer between the free layer and a pinning layer, and a barrier layer is disposed between the free layer and the pinned layer.

6. A magnetic junction memory array according to claim 1, wherein the magnetic bit is disposed on a free layer of a magnetic junction and the magnetic junction comprises a pinned layer between the free layer and a pinning layer, and a barrier layer is disposed between the free layer and the pinned layer.

7. A magnetic junction memory array according to claim 1, wherein the magnetic junction memory array is a write-once magnetic junction memory array or a read-only magnetic junction memory array.

8. A memory writing apparatus comprising:
a probe comprising a magnetic field data writing head;
a stage disposed adjacent to the probe;
an x-y plane actuator coupled to the probe or the platform, the x-y plane actuator providing relative x-y plane movement between the probe and the stage; and
a magnetic junction memory array interchangeably disposed on the stage, the magnetic junction memory array comprising:

a plurality of electrically conductive word lines extending in a first direction;
a plurality of electrically conductive bit lines extending in a second direction and forming a cross-point array with the plurality of electrically conductive word lines;
a memory cell proximate to, at least selected, cross-points forming a magnetic junction memory array, each memory cell comprising a magnetic bit and an isolation transistor, the isolation transistor comprising a current source and a gate, the current source is electrically coupled to the bit line and the gate is electrically coupled to the word line; and
an electrically conductive cover layer disposed on and in electrical communication with the magnetic bits;
wherein the electrically conductive cover layer is between the magnetic field data writing head and the magnetic bit.

9. A memory writing apparatus according to claim 8, further comprising a servo code track comprising a plurality of patterned permanent magnetic bits proximate to memory cell magnetic bits, wherein the servo code track provides track registration for the magnetic field data writing head.

10. A memory writing apparatus according to claim 9, further comprising a magnetic field read head disposed on the probe, wherein the magnetic field read head reads the servo code track and provides track registration for the magnetic field data writing head.

11. A memory writing apparatus according to claim 8, wherein the magnetic field data writing head is proximate to the magnetic bit and applies a magnetic field to the magnetic bit to fix a magnetization orientation of the magnetic bit.

12. A memory writing apparatus according to claim 8, wherein the magnetic junction memory array is a write-once magnetic junction memory array or a read-only magnetic junction memory array.

13. A memory writing apparatus according to claim 8, wherein the electrically conductive cover layer is in electrical communication with a current drain.

14. A memory writing apparatus according to claim 8, wherein the magnetic bit forms a free layer of a magnetic junction and the magnetic junction comprises a pinned layer between the free layer and a pinning layer, and a barrier layer is disposed between the free layer and the pinned layer.

15. A method comprising;
providing a magnetic junction memory array comprising:
a plurality of electrically conductive word lines extending in a first direction;
a plurality of electrically conductive bit lines extending in a second direction and forming a cross-point array with the plurality of electrically conductive word lines;
a memory cell proximate to, at least selected, cross-points forming a magnetic junction memory array, each memory cell comprising a magnetic pinned layer between a magnetic bit and an isolation transistor, the isolation transistor comprising a current source and a gate, the current source is electrically coupled to the bit line and the gate is electrically coupled to the word line; and
an electrically conductive cover layer disposed on and in electrical communication with the magnetic bits; and
writing data to the magnetic bits with a magnetic field data writing head, the magnetic field data writing head being movable relative to the magnetic junction memory array.

16. A method according to claim 15, wherein the magnetic junction memory array further comprises a servo code track comprising a plurality of patterned permanent magnetic bits proximate to memory cell magnetic bits, wherein the servo code track is read by a magnetic field read head coupled to the magnetic field writing head and provides track registration for the magnetic field data writing head.

17. A method according to claim 15, wherein the magnetic junction memory array is disposed on a stage and is removed from the stage and the magnetic field data writing head following the writing step.

18. A method according to claim 17, further comprising placing a second magnetic junction memory array on the stage and repeating the writing step to the second magnetic junction memory array.

19. A method according to claim 17, further comprising reading the data stored on the magnetic bits by applying a voltage across a selected memory cell and measuring a resistance across the memory cell.

20. A method according to claim 19, further comprising placing the magnetic junction memory array on the stage and repeating the writing step to the magnetic junction memory array.

* * * * *

UNITED STATES PATENT AND TRADEMARK OFFICE
CERTIFICATE OF CORRECTION

PATENT NO. : 8,659,852 B2  Page 1 of 1
APPLICATION NO. : 12/106363
DATED : February 25, 2014
INVENTOR(S) : Haiwen Xi and Song S. Xue It is certified that error appears in the above-identified patent and that said Letters Patent is hereby corrected as shown below:

On the Title Page, Item (54) and in the Specification, Column 1, Lines 1-2, please amend the title of the application as follows:

Replace "WRITE-ONCE MAGENTIC JUNCTION MEMORY ARRAY" with
--WRITE-ONCE MAGNETIC JUNCTION MEMORY ARRAY--

Signed and Sealed this
Twenty-seventh Day of May, 2014

Michelle K. Lee
*Deputy Director of the United States Patent and Trademark Office*